(12) United States Patent
Chung et al.

(10) Patent No.: US 11,404,403 B2
(45) Date of Patent: Aug. 2, 2022

(54) MICRO LED DISPLAY MODULE AND METHOD OF MANUFACTURING THE SAME

(71) Applicant: SAMSUNG ELECTRONICS CO., LTD., Suwon-si (KR)

(72) Inventors: Changkyu Chung, Suwon-si (KR); Kyungwoon Jang, Suwon-si (KR); Changjoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/901,561

(22) Filed: Jun. 15, 2020

(65) Prior Publication Data

US 2021/0005588 A1 Jan. 7, 2021

(30) Foreign Application Priority Data

Jul. 4, 2019 (KR) .................. 10-2019-0080580

(51) Int. Cl.
 *H01L 25/16* (2006.01)
 *H01L 21/683* (2006.01)
 (Continued)

(52) U.S. Cl.
 CPC ........ *H01L 25/167* (2013.01); *H01L 21/6835* (2013.01); *H01L 25/0753* (2013.01);
 (Continued)

(58) Field of Classification Search
 CPC ... H01L 25/167; H01L 21/6835; H01L 33/62; H01L 25/0753; H01L 2933/0066;
 (Continued)

(56) References Cited

U.S. PATENT DOCUMENTS

| 6,767,763 B1 * | 7/2004 | Uchiyama | ............... H01L 24/31 |
| | | | 156/322 |
| 9,536,856 B2 | 1/2017 | Seyama | |

(Continued)

FOREIGN PATENT DOCUMENTS

| CN | 107887331 A | 4/2018 |
| JP | 2003-504847 A | 2/2003 |

(Continued)

OTHER PUBLICATIONS

International Search Report (PCT/ISA/210) dated Sep. 25, 2020 issued by the International Searching Authority in International Application No. PCT/KR2020/007797.

(Continued)

*Primary Examiner* — Vu A Vu
(74) *Attorney, Agent, or Firm* — Sughrue Mion, PLLC

(57) ABSTRACT

A method of manufacturing a micro light emitting diode (LED) display module includes stacking a connecting layer onto a transfer substrate on which a micro LED is disposed; positioning the transfer substrate above a display substrate, in which a plurality of thin-film transistors are formed, so that the micro LED faces the display substrate; transferring, to the display substrate, the micro LED and a connecting member that is in contact with the micro LED and is separated from the connecting layer by using a laser transfer method; and heating the micro LED and compressing the micro LED against the display substrate to bond the micro LED to the display substrate by the connecting member.

13 Claims, 22 Drawing Sheets

(51) Int. Cl.
*H01L 33/62* (2010.01)
*H01L 25/075* (2006.01)

(52) U.S. Cl.
CPC .... *H01L 33/62* (2013.01); *H01L 2221/68363* (2013.01); *H01L 2221/68381* (2013.01); *H01L 2933/0066* (2013.01)

(58) Field of Classification Search
CPC . H01L 2221/68363; H01L 2221/68381; H01L 2924/18161; H01L 2924/181; H01L 2224/32225; H01L 2224/73204; H01L 2224/16225; H01L 24/95; H01L 24/81; H01L 2224/83851; H01L 2221/68354; H01L 2221/68322
USPC .......................................................... 257/72
See application file for complete search history.

(56) References Cited

U.S. PATENT DOCUMENTS

| | | | |
|---|---|---|---|
| 9,557,954 B2* | 1/2017 | Jepsen | G09G 3/3208 |
| 10,361,351 B2 | 7/2019 | Kwak et al. | |
| 10,546,842 B2* | 1/2020 | Hu | H01L 33/62 |
| 2016/0336304 A1 | 11/2016 | Wu et al. | |
| 2017/0179097 A1* | 6/2017 | Zhang | H01L 33/0093 |
| 2018/0175262 A1* | 6/2018 | Jansen | H01L 33/54 |
| 2018/0248090 A1 | 8/2018 | Huska et al. | |
| 2018/0342492 A1* | 11/2018 | Lu | H01L 22/20 |
| 2019/0057891 A1 | 2/2019 | Marinov et al. | |
| 2019/0067539 A1 | 2/2019 | Kwak et al. | |
| 2019/0157340 A1 | 5/2019 | Liao et al. | |
| 2020/0219855 A1* | 7/2020 | Chen | H01L 33/483 |

FOREIGN PATENT DOCUMENTS

| | | |
|---|---|---|
| JP | 2018-98337 A | 6/2018 |
| JP | 2019-503081 A | 1/2019 |
| KR | 10-0720408 B1 | 5/2007 |
| KR | 5675008 B1 | 2/2015 |
| KR | 10-2018-0073971 A | 7/2018 |
| KR | 10-2018-0112197 A | 10/2018 |
| KR | 10-2019-0021028 A | 3/2019 |
| KR | 10-1972481 B1 | 4/2019 |
| KR | 10-2019-0060287 A | 6/2019 |

OTHER PUBLICATIONS

Written Opinion (PCT/ISA/237) dated Sep. 25, 2020 issued by the International Searching Authority in International Application No. PCT/KR2020/007797.

* cited by examiner

MICRO LED DISPLAY MODULE AND METHOD OF MANUFACTURING THE SAME

CROSS-REFERENCE TO RELATED APPLICATION(S)

This application is based on and claims priority under 35 U.S.C. § 119 to Korean Patent Application No. 10-2019-0080580, filed on Jul. 4, 2019, in the Korean Intellectual Property Office, the disclosure of which is incorporated by reference herein in its entirety.

BACKGROUND

1. Field

The disclosure relates to a display module providing improved manufacturing efficiency and space efficiency, and a method of manufacturing the same.

2. Description of Related Art

A micro light emitting diode (LED), which is a self-emissive inorganic display device, is a self-luminous micro inorganic light emitting element and may refer to an LED having a width, length, and height in the range of 10 to 100 The micro LED may be manufactured in a form of a chip on a wafer, and may be disposed on a target substrate to provide a light emitting module of a display.

A display apparatus using micro LEDs may be manufactured by bonding, on a substrate including a thin-film transistor, tens of thousands to tens of millions of micro LEDs at small intervals.

The process of bonding the plurality of micro LEDs on the substrate is a process of efficiently bonding the plurality of micro LEDs in a space of the substrate and electrically and physically connecting the plurality of micro LEDs to the substrate, which is necessary for manufacturing of a display module including a micro LED.

SUMMARY

Provided are a display module implementing an improved manufacturing efficiency and space efficiency, and a method of manufacturing the same.

According to an aspect of the disclosure, a method of manufacturing a micro light emitting diode (LED) display module includes stacking a connecting layer onto a transfer substrate on which a micro LED is disposed; positioning the transfer substrate above a display substrate, in which a plurality of thin-film transistors are formed, so that the micro LED faces the display substrate; transferring, to the display substrate, the micro LED and a connecting member that is in contact with the micro LED and is separated from the connecting layer by using a laser transfer method; and heating the micro LED and compressing the micro LED against the display substrate to bond the micro LED to the display substrate by the connecting member.

The display substrate may be divided into a first area and a second area, and the transferring of the micro LED may include transferring the micro LED only to the first area, leaving the second area reserved for an alternative micro LED in case that the micro LED transferred to the first area is defective.

The heating and compressing of the micro LED may include heating and compressing the micro LED until a portion of the connecting member that is in contact with a first surface of the micro LED comes into contact with a plurality of electrode pads formed on the display substrate and a portion of the connecting member that is in contact with a side surface of the micro LED forms a curved portion without covering a light emitting surface of the micro LED.

The method may further include applying a light blocking layer onto the display substrate, wherein the light blocking layer exposes a light emitting surface of the micro LED and covers the display substrate.

The transferring of the micro LED may include separating the micro LED from the transfer substrate by expanding an adhesive layer formed between the micro LED and the transfer substrate through heating using a laser irradiation method.

The adhesive layer may include a dynamic release layer.

The positioning of the transfer substrate may include arranging the plurality of electrode pads disposed on the display substrate and connected to each of the plurality of thin-film transistors to each face a respective one of a plurality of connecting pads of the micro LED.

The connecting member may include an anisotropic conductive film or anisotropic conductive paste.

A soldering member may be disposed on each of the plurality of connecting pads. The connecting member may include a non-conductive material having a fluxing function, and the heating and compressing of the micro LED may include electrically connecting the plurality of electrode pads and the plurality of connecting pads through the soldering members.

According to another aspect of the disclosure, a micro LED display module includes a plurality of micro LEDs; a substrate on which the plurality of micro LEDs are disposed; a plurality of thin-film transistors disposed in the substrate; a plurality of electrode pads connected to each of the plurality of thin-film transistors; and a plurality of connecting members configured to connect each of the plurality of micro LEDs to the plurality of electrode pads. The plurality of connecting members may be spaced apart from each other.

A side surface portion of each of the plurality of connecting members may define a curved surface, the side surface portion of each of the plurality of connecting members may be in contact with a side surface of a respective micro LED.

The substrate may be divided into a first area and a second area. The second area may be configured to accept an alternative micro LED in case that a micro LED transferred to the first area is defective, and the plurality of micro LEDs may each be connected only to portions of the plurality of electrode pads located in the first area.

The display module may further include a light blocking layer configured to expose a light emitting surface of each of the plurality of micro LEDs and cover the substrate.

Each of the plurality of micro LEDs may include a plurality of connecting pads facing the plurality of electrode pads, and the plurality of connecting members may each fill a space between the plurality of electrode pads and the plurality of connecting pads.

The plurality of connecting members may include anisotropic conductive films or anisotropic conductive paste, and the plurality of connecting members may electrically connect the plurality of connecting pads and the plurality of electrode pads to each other.

The display module may further include a soldering member disposed between each of the plurality of electrode pads and a connecting pad corresponding to each electrode pad and configured to electrically connect the plurality of electrode pads and the plurality of connecting pads to each other. The plurality of connecting members may include a non-conductive material having a fluxing function.

The plurality of micro LEDs may include a red micro LED which emits red light, a green micro LED which emits green light, and a blue micro LED which emits blue light. The red micro LED, the green micro LED, and the blue micro LED may be sequentially arranged on the substrate.

According to another aspect of the disclosure, a display apparatus includes a plurality of micro LED display modules; an arrangement member configured to support the plurality of micro LED display modules; and a housing to which the plurality of micro LED display modules and the arrangement member are fixed. Each of the plurality of micro LED display modules may include a plurality of micro LEDs, a substrate on which a plurality of electrode pads are disposed and in which a plurality of thin-film transistors are disposed, and a plurality of connecting members connecting each of the plurality of micro LEDs to the plurality of electrode pads, and the plurality of electrode pads may be partially exposed through the plurality of connection members.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
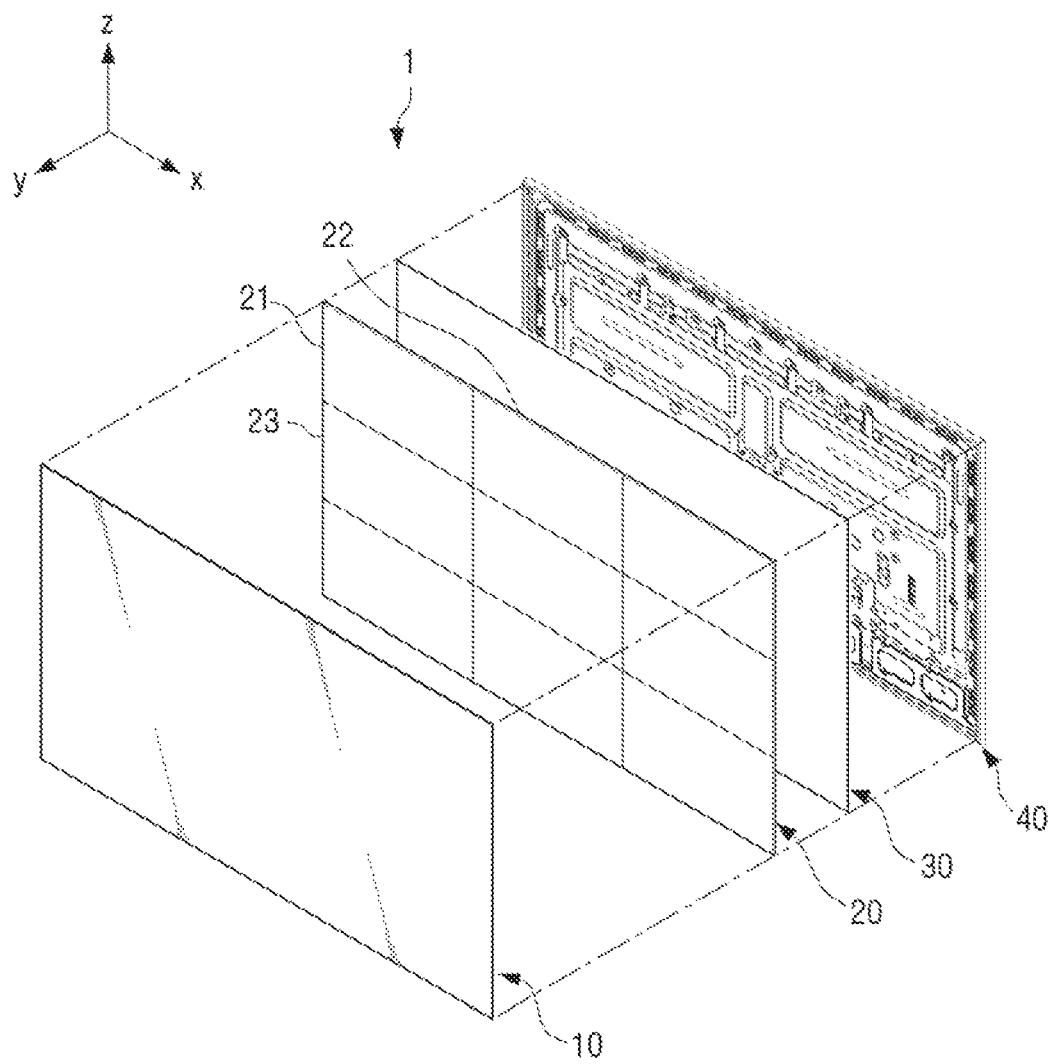
FIG. 1 is an exploded perspective view illustrating a display apparatus according to an embodiment.

In order to provide a full understanding of the disclosure, embodiments of the disclosure will be described with reference to the accompanying drawings. The disclosure may, however, be embodied in many different forms and should not be construed as limited to the embodiments set forth herein, and various modifications may be made. It should be understood, however, that the description of the embodiments is provided to enable the disclosure, and will fully convey the scope of the disclosure to a person having ordinary skill in the art to which the disclosure pertains. In the accompanying drawings, the constituent elements may be enlarged in size for convenience of explanation and the proportion of each constituent element may be exaggerated or reduced.

It will be understood that when a constituent element is referred to as being "on" or "connected to" another element, it may be directly connected or directly coupled to another constituent element, or an intervening constituent element may be present therebetween. In contrast, when a constituent element is referred to as being "directly on" or "directly connected to" another constituent element, no intervening constituent element is present therebetween. Other expressions describing relationships between constituent elements such as "between A and B" and "directly between A and B" may be construed similarly.

Terms such as "first" and "second" may be used to describe various constituent elements, but the constituent elements are not to be construed as being limited to the terms. The terms are only used to differentiate one constituent element from another constituent element. For example, the "first" constituent element may be named the "second" constituent element without being departed from the scope of the disclosure and the "second" constituent element may also be similarly named the "first" constituent element.

Singular forms are intended to include plural forms unless the context clearly indicates otherwise. Terms "include" or "have" used in the specification are to specify the presence of stated features, numerals, steps, operations, components, parts, or a combination thereof, and it may be construed that addition of one or more other features, numerals, steps, operations, components, parts, or a combination thereof is possible.

Unless otherwise defined, all terms used in the embodiments of the disclosure have the same meaning as commonly understood by a person having ordinary skills in the art to which the disclosure pertains.

A display module according to an embodiment may be a flat display panel in which multiple micro light emitting diodes (micro LED or μLED), each having a size of 100 μm or less (preferably, 30 μm or less), are arranged and the micro light emitting diodes may be inorganic light emitting diodes (inorganic LEDs). As compared with a liquid crystal display (LCD) panel requiring a backlight, a display module according to an embodiment may offer better contrast, response times, and energy efficiency.

A micro LED according to an embodiment has advantages such as a rapid response speed, a low power, a high brightness, and a long life, and thus is in the spotlight as a light emitting element of the next generation display. Specifically, the micro LED may convert electricity into photons more efficiently than an existing LCD or an organic light emitting diode (OLED). In other words, a "brightness per watt" of the micro LED may be higher than that of the existing LCD or OLED display. Therefore, the micro LED may have the same brightness with only about a half of energy consumption, in comparison to the existing LED (a width, a length, and a height thereof each exceed 100 μm) or OLED. In addition, the micro LED may achieve a high resolution and excellently express color tones, light and shade, and brightness to accurately express color tones in a wide range, thereby making it possible to implement a clear screen even in the outdoors where sunlight is bright. Further, the micro LED may be resistant to a burn-in phenomenon and rarely generates heat, and thus may have a long life without deformation.

A micro LED according to an embodiment may have a flip chip structure in which an anode and a cathode are both formed on a first surface, and a light emitting surface may be formed on a second surface opposite to the first surface on which the anode and the cathode are formed.

A display module according to an embodiment may be installed in and applied to a wearable device, a portable device, a handheld device, and various electronic products or electric parts requiring a display, as a single unit. Further, a plurality of display modules may be assembled in a matrix form and applied to a display apparatus such as a monitor for a personal computer (PC), a high-resolution TV, or a signage.

Hereinafter, a structure of a display apparatus 1 according to an embodiment will be described with reference to FIG. 1.

FIG. 1 is an exploded perspective view illustrating a display apparatus 1 according to an embodiment.

The display apparatus 1 may process a received image signal and visually display a processed image. The display apparatus 1 may be implemented in various forms such as a television, a monitor, a mobile multimedia apparatus, and a mobile communication apparatus, but the form of the display apparatus 1 is not limited as long as it visually displays an image.

As shown in FIG. 1, the display apparatus 1 may include a protection member 10, a plurality of micro LED display modules 20, an arrangement member 30, and a housing 40.

The protection member 10 may be disposed in the front (Y-axis direction) of the display apparatus 1, and protect the plurality of display modules 20 disposed behind the protection member 10 from the outside.

The protection member 10 may be formed of a glass material with a small thickness, and may be formed of various materials as necessary.

The plurality of micro LED display modules 20 may provide light to display an image in a front direction (Y-axis direction) based on an image signal input from the outside.

Moreover, the plurality of micro LED display modules 20 may provide a display screen in a manner in which the respective micro LED display modules 20 manufactured as modules that are arranged to fit a size of a display to be implemented.

For example, in case that a first micro LED display module 21 and a second micro LED display module 22 are arranged side by side in a horizontal direction (X-axis direction), the display screen may be longer in the horizon direction (X-axis direction) than in a vertical direction (Z-axis direction).

Alternatively, in case that the first micro LED display module 21 and a third micro LED display module 23 are arranged side by side in the vertical direction (Z-axis direction), the display screen may be longer in the vertical direction (Z-axis direction) than in a horizontal direction (X-axis direction).

Therefore, it is possible to implement various sizes and shapes of display screens based on the number of the plurality of arranged micro LED display modules 20 and a form in which the plurality of micro LED display modules 20 are arranged.

Figure 2:
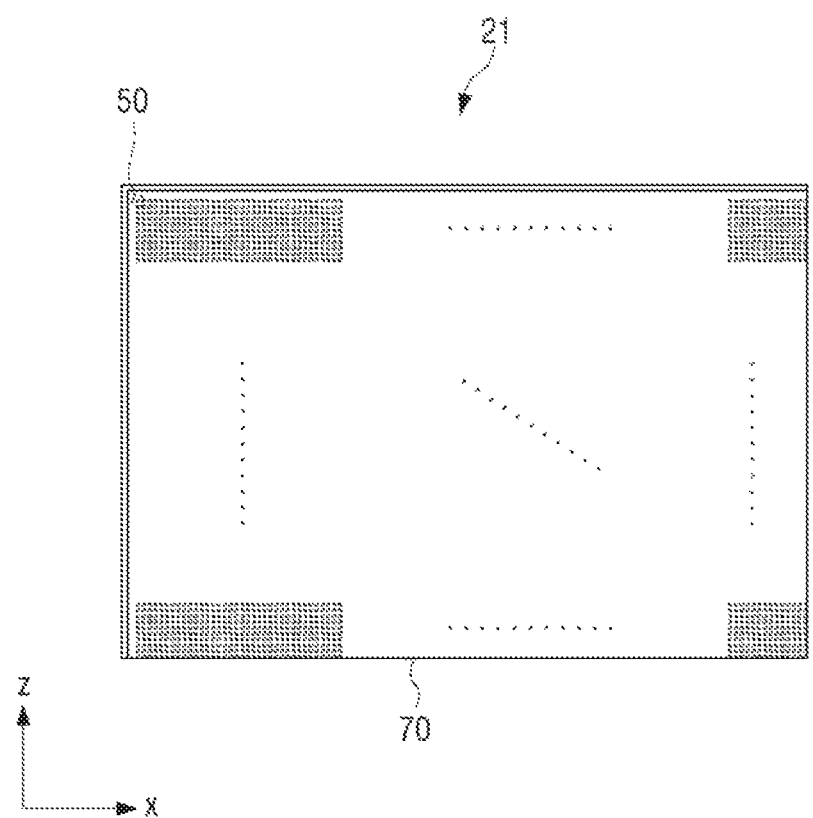
FIG. 2 is a plan view illustrating a first micro light emitting diode (LED) display module according to an embodiment.
Figure 3:
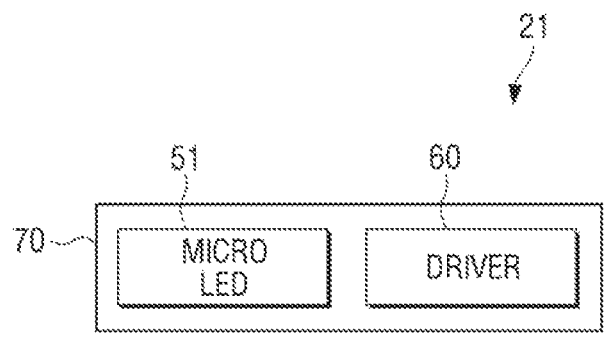
FIG. 3 is a block diagram illustrating a micro LED and a driver according to an embodiment.

A detailed description of the micro LED display module 20 will be provided with reference to FIGS. 2 and 3.

The arrangement member 30, which may be a plate on which the plurality of micro LED display modules 20 may be arranged, may be disposed behind the plurality of micro LED display modules 20.

The arrangement member 30 may be provided as a flat plate, and may be provided in various shapes and sizes according to the shape and the size of the plurality of micro LED display modules 20.

The arrangement member 30 may support the plurality of micro LED display modules 20 to arrange the plurality of micro LED display modules 20 parallel to one another on the same plane.

Further, with the arrangement member 30, a uniform brightness of the display screen may be provided due to the micro LED display modules 20 being planar.

The housing 40 may form an appearance of the display apparatus 1, be disposed behind the arrangement member 30, and rigidly fix the plurality of micro LED display modules 20 and the arrangement member 30.

Further, the housing 40 may rigidly fix an edge region of the protection member 10.

Therefore, the housing 40 may prevent various components included in the display apparatus 1 from being exposed to the outside, and protect the various components included in the display apparatus 1 from an external impact.

Hereinafter, a specific structure and operation of an embodiment of the micro LED display module 20 will be described with reference to FIGS. 2 and 3.

FIG. 2 is a plan view illustrating a first micro LED display module 21 according to an embodiment, and FIG. 3 is a block diagram illustrating a micro LED 51 and a driver 60 according to an embodiment.

In FIG. 1, the number of micro LED display modules 20 is plural, but the first micro LED display module 21 will be mainly described for convenience of explanation.

The first micro LED display module 21 may include a display substrate 70 including a plurality of thin-film transistors 140 (see FIG. 5C), a plurality of pixels 50 arranged in a lattice provided on the display substrate 70, and the driver 60 driving the plurality of pixels 50.

A pixel 50 may refer to a pixel as a minimum unit for various colors. A detailed structure of a pixel 50 will be described with reference to FIG. 4.

The display substrate 70 may be electrically connected to each of micro LEDs 51 mounted in a matrix form on the display substrate 70 to control the micro LEDs 51 through a driving signal of the driver 60.

The display substrate 70 may be a thin-film transistor (TFT) substrate including a thin-film transistor. Further, the display substrate 70 may be formed of various materials such as a ductile material, a glass material, or a plastic material, and may include a TFT layer having one surface on which a TFT circuit is formed. Multiple TFT electrodes to which electrodes of the micro LEDs are connected may be provided in the TFT layer, and the TFT layer may have a film form and be attached to one surface of the display substrate 70. Further, the display substrate 70 may be referred to as target substrate.

The driver 60 may control the plurality of pixels 50 and the plurality of micro LEDs 51 included in one pixel 50 to display an image.

The driver 60 may be connected to the display substrate 70 by a Chip on Glass (COG) bonding method or a Film on Glass (FOG) bonding method at an edge region of the display substrate 70 or a back surface of the display substrate 70.

However, a position of the driver 60 on the display substrate 70 and a bonding method are not limited thereto, and may vary.

Further, the driver 60 may transfer a gate signal and a source signal to the thin-film transistors included in the display substrate 70 to control a brightness and a color of one pixel 50.

Further, the driver 60 may control the plurality of micro LED display modules 20 by using various methods such as a passive matrix (PM) driving method and an active matrix (AM) driving method.

Hereinafter, structures of a pixel 50 and the micro LED display module 20 according to an embodiment will be described in detail with reference to FIGS. 4 to 5C.

Figure 4:
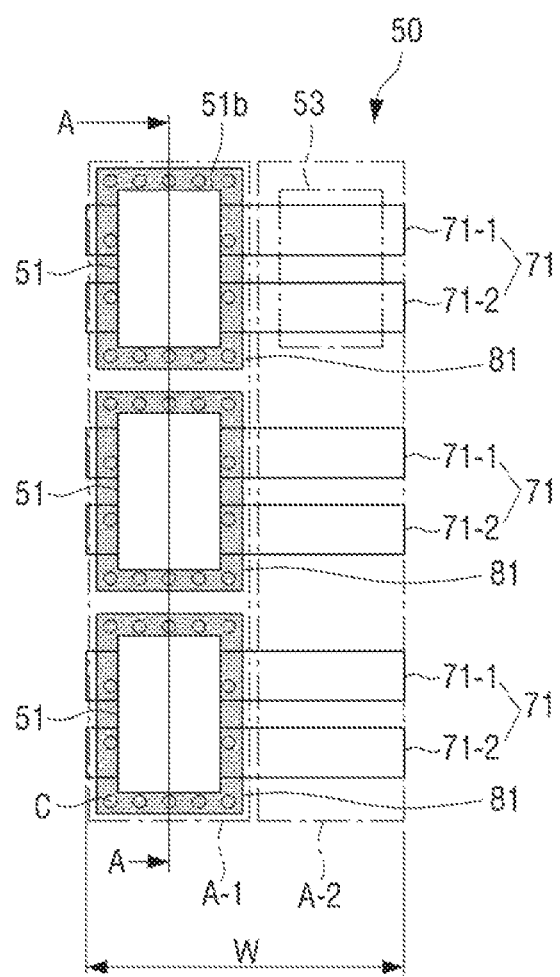
FIG. 4 is a plan view illustrating one pixel according to an embodiment.
Figure 5A:
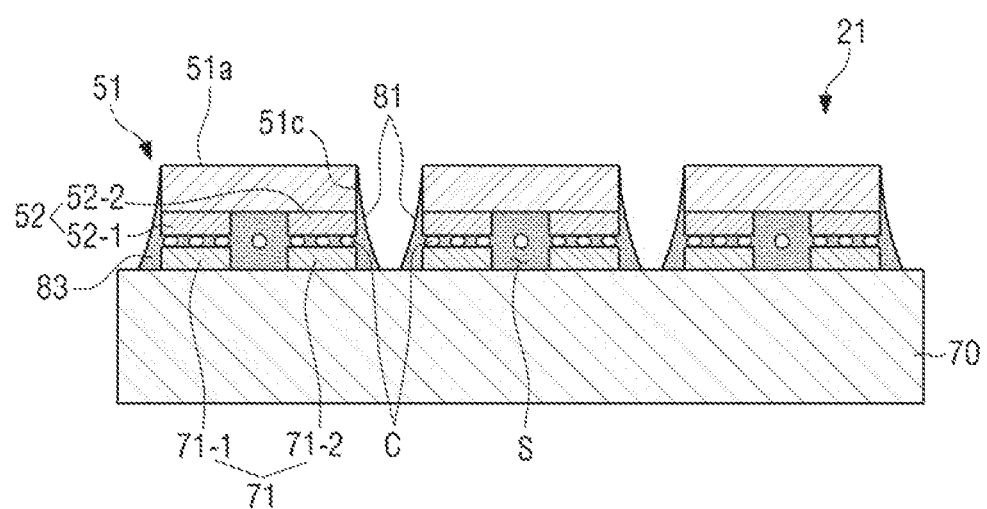
FIG. 5A is a cross-sectional view taken along line A-A of FIG. 4 according to an embodiment.
Figure 5B:
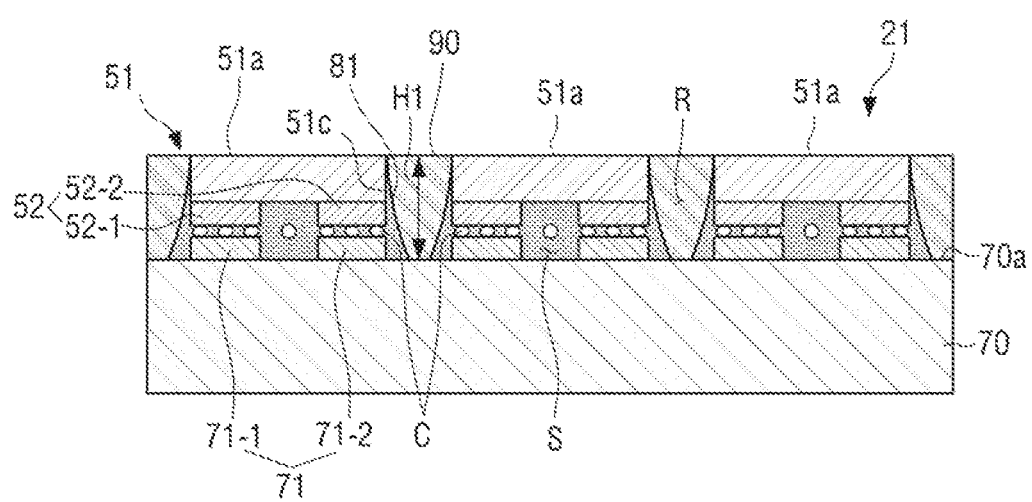
FIG. 5B is a cross-sectional view illustrating a state in which a light blocking layer is formed on the structure of FIG. 5A according to an embodiment.
Figure 5C:
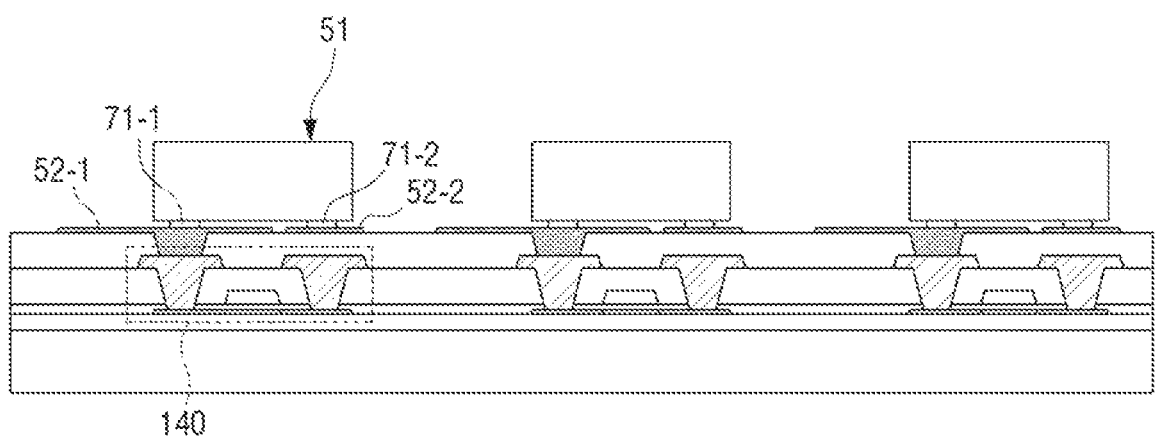
FIG. 5C is a cross-sectional view illustrating a plurality of thin-film transistors in the structure of FIG. 4 according to an embodiment.

FIG. 4 is a plan view illustrating one pixel 50 according to an embodiment, FIG. 5A is a cross-sectional view taken along line A-A of FIG. 4, FIG. 5B is a cross-sectional view illustrating a state in which a light blocking layer 90 is formed in a structure of FIG. 5A, and FIG. 5C is a cross-sectional view illustrating the plurality of thin-film transistors 140 in a structure of FIG. 4.

The pixels 50 may be arranged at an upper surface of the micro LED display module 20 at a predetermined interval, and may include a plurality of micro LEDs 51.

For example, the plurality of micro LEDs 51 included in the pixel 50 may include a red micro LED which emits red light, a green micro LED which emits green light, and a blue micro LED which emits blue light. The micro LED 51 may be formed of an inorganic light emitting material having a width of 100 μm or less, a length of 100 μm or less, and a height of 100 μm or less, and may be disposed on the display substrate 70 and emit light by itself.

Further, the plurality of micro LEDs 51 may be sequentially arranged on the display substrate 70 as shown in FIG. 4.

By doing so, the plurality of micro LEDs 51 may provide various colors and brightness as one pixel 50.

The micro LED 51 may provide a rapid response speed, a low power, and a high brightness. Specifically, the micro LED 51 converts electricity into photons more efficiently.

In other words, a brightness per watt of the micro LED 51 is high. Therefore, the micro LED 51 may have the same brightness with only about a half of energy consumption, in comparison to the existing LED or OLED.

In addition, the micro LED 51 may achieve a high resolution and excellently express color tones, light and shape, and brightness to accurately express color tones in a wide range, thereby making it possible to implement a clear screen even in the outdoors where sunlight is bright. Further, the micro LED 51 may be resistant to a burn-in phenomenon and may rarely generate heat, and thus may have a long life without deformation.

Further, one micro LED 51 may be a flip-chip LED.

In addition, one micro LED 51 may include a pair of connecting pads 52 as shown in FIG. 5A. For example, the pair of connecting pads 52 may include a first connecting pad 52-1 and a second connecting pad 52-2 spaced apart from the first connecting pad 52-1.

Further, the plurality of connecting pads 52 may be formed on a first surface 51d (see FIG. 6) of the micro LED 51. Here, the first surface Md is opposite to a second surface Ma. Further, the second surface Ma is a surface where light is emitted from the micro LED 51, and may be referred to as light emitting surface or upper surface.

That is, the micro LED 51 may include the plurality of connecting pads 52 disposed to face a plurality of electrode pads 71.

For example, a first electrode pad 71-1 may be disposed to face the first connecting pad 52-1, and a second electrode pad 71-2 may be disposed to face the second connecting pad 52-2.

Further, the first connecting pad 52-1 may be electrically connected to the first electrode pad 71-1 of the display substrate 70, and the second connecting pad 52-2 may be electrically connected to the second electrode pad 71-2 of the display substrate 70.

The display substrate 70 may include the plurality of electrode pads 71 above which the micro LED 51 is disposed.

The plurality of electrode pads 71 may be formed of a conductive material, and may be electrically connected to each of the plurality of thin-film transistors 140 disposed in the display substrate 70.

Further, the plurality of electrode pads 71 may be arranged on one surface of the display substrate 70 at a predetermined interval.

Further, the plurality of electrode pads 71 may be connected to each of the plurality of thin-film transistors 140 formed in the display substrate 70. That is, a pair of electrode pads 71 may be electrically connected to one thin-film transistor.

Therefore, the plurality of electrode pads 71 may transfer, to the micro LED 51 seated on the plurality of electrode pads 71, an electric signal transferred from the driver 60 and the plurality of thin-film transistors 140.

Further, the plurality of electrode pads 71 may include the first electrode pad 71-1 and the second electrode pad 71-2 spaced apart from each other at a predetermined interval and arranged parallel to each other.

Here, the first electrode pad 71-1 and the second electrode pad 71-2 may be an anode and a cathode for driving the micro LED 51, respectively.

Further, the first electrode pad 71-1 and the second electrode pad 71-2 may form a pair, and one pair of electrode pads in the pixel 50 may be spaced apart from another pair of electrode pads.

In addition, the first electrode pad 71-1 and the second electrode pad 71-2 may have the same length, and the first electrode pad 71-1 and the second electrode pad 71-2 may each have a width W two or more times larger than a length of a short side 51$b$ of one micro LED 51.

Therefore, the micro LED 51 or a repairing micro LED 53 which replaces the micro LED 51 in case that the micro LED 51 is defective may be disposed on the pair of electrode pads 71-1 and 71-2.

The pixel 50 may have a first area A-1 in which a first micro LED 51 is disposed on the plurality of electrode pads 71, and a second area A-2 which is adjacent to the first area A-1 on the plurality of electrode pads 71 and in which a new second micro LED 53 is disposed in case that the first micro LED 51 is defective.

That is, the second area A-2 may refer to an area reserved for an alternative micro LED 53 in case that the micro LED 51 transferred to the first area A-1 is defective.

Here, the first micro LED 51 may be disposed in the first area A-1, the number of first micro LEDs 51 may be plural, and the first micro LEDs 51 may be seated on the display substrate 70.

Further, the second micro LED 53 may be referred to as alternative micro LED or repairing micro LED.

Further, the second micro LED 53 may be referred to as repairing micro LED, and may be disposed in the second area A-2 of the pixel 50. The second area A-2 may be referred to as repairing area.

In addition, the micro LED display module may include a connecting member 81 positioned to correspond to the micro LED 51 and connecting the micro LED 51 and the plurality of electrode pads 71 to each other.

The connecting member 81 may correspond to one micro LED and may be positioned to be adjacent to one micro LED. Further, the connecting member 81 may refer to a portion separate from a connecting layer 80 shown in FIG. 7.

The connecting member 81 may electrically and physically connect the micro LED 51 and the plurality of electrode pads 71 of the display substrate 70 to each other.

Further, multiple connecting members 81 may be provided, and each connecting member 81 may be positioned to correspond to one micro LED 51.

The connecting members 81 may be formed of a material including conductive particles C provided in a non-conductive material. Examples of the plurality of connecting members 81 may include anisotropic conductive films (ACF) or anisotropic conductive paste (ACP).

Here, the ACF may be an anisotropic conductive film that is formed by mixing fine conductive particles C with an adhesive resin and conducts electricity only in a single direction.

The ACP may be an anisotropic conductive material that is formed by mixing fine conductive particles C with an adhesive resin to maintain adhesiveness and conducts electricity only in a single direction.

Further, the connecting members 81 may be formed of a polymer material containing nano-sized or micro-sized conductive particles C.

The conductive particles C may be metal particles such as nickel (Ni) and copper (Cu), carbon particles, solder balls, or polymer balls coated with metal. The conductive particles C may be arranged in lines in the non-conductive material, or may be randomly arranged.

As a result, the connecting members 81 may electrically connect the plurality of connecting pads 52 and the plurality of electrode pads 71 to each other through the conductive particles C.

Further, the connecting members 81 may fill a space S formed between the plurality of connecting pads 52 and the plurality of electrode pads 71. As a result, the connecting members 81 formed of the non-conductive material may insulate between the plurality of connecting pads 52 and the plurality of electrode pads 71, thereby preventing a short circuit.

That is, the connecting member 81 may electrically connect the micro LED 51 and the display substrate 70 to each other, and at the same time, may prevent a short circuit between the micro LED 51 and the display substrate 70.

Further, the connecting member 81 may be disposed to cover a side surface 51$c$ of the micro LED 51.

For example, as shown in FIG. 5A, a portion of the connecting member 81 may be disposed to cover the side surface 51$c$ of the micro LED 51 and may have a specific curvature.

That is, a side surface portion of the connecting member 81 may form a curved portion 83 on the display substrate 70, the side surface portion being in contact with the side surface 51$c$ of the micro LED 51.

Specifically, a thickness of the curved portion 83 which is a part of the connecting member 81 may increase as distance from the upper surface 51$a$ of the first micro LED 51 increases.

As a result, the connecting member 81 may rigidly fix the micro LED 51 to the display substrate 70.

That is, the connecting member 81 may prevent the micro LED 51 from being separated from the display substrate 70 even in case that an impact is applied to one micro LED display module 20 in which the micro LED 51 is bonded.

Further, the connecting member 81 may be configured to expose the upper surface 51$a$ of the micro LED 51. As a result, the connecting member 81 does not cover the upper surface 51$a$ of the micro LED 51 that is to be irradiated with light, thereby preventing loss of irradiated light.

Further, the connecting members 81 may be spaced apart from each other.

In case that one of first micro LEDs 51 disposed in the first area A-1 needs to be removed (for example, repairing), it is possible to remove only one connecting member 81 corresponding to the one first micro LED 51, because the connecting members 81 are spaced apart from each other.

As a result, it is possible to prevent an adjacent connecting member 81 from being physically affected by removal of one first micro LED 51 in case that all of the connecting members 81 are connected and hardened.

As shown in FIG. 4, the connecting member 81 may be disposed only in the first area A-1 and does not have to be disposed in the second area A-2. That is, the connecting members 81 may partially expose the plurality of electrode pads 71.

Therefore, in case that one of the micro LEDs 51 included in the pixel 50 is defective, the second micro LED 53 may be disposed in the second area A-2.

That is, the micro LED 51 may be connected only to a portion of the plurality of electrode pads 71 in the first area A-1.

The second micro LED 53 may be easily transferred and bonded, because the connecting member 81 and the connecting layer 80 are not formed on a portion of the plurality of electrode pads 71 in the second area A-2 in which the second micro LED 53 is to be disposed.

Specifically, in case that a connecting member for connecting a micro LED is applied to one surface of the display substrate 70 and the micro LED is disposed thereon, an additional process of removing a hardened portion of the connecting member that corresponds to the second area A-2 is required to dispose the second micro LED 53 in the second area A-2.

The micro LED display module 20 according to an embodiment does not require the additional process of removing a hardened portion described above, and thus it is possible to greatly improve convenience in repairing as well as manufacturing efficiency of the micro LED display module 20.

Since the connecting members 81 are spaced apart from each other, a gap portion R in which a light blocking layer 90 may be disposed may be provided. The light blocking layer 90 may completely fill a height H1 up to the upper surface M a of the micro LED 51 and cover an upper surface 70a of the display substrate 70, and thus light absorption efficiency of the light blocking layer 90 may be improved.

That is, the light absorption efficiency of the light blocking layer 90 may be increased in proportion to a thickness of the light blocking layer 90, and a space in which the thick light blocking layer 90 may be formed may be provided, because the connecting members 81 are spaced apart from each other.

The light blocking layer 90 having a certain thickness and height or larger may be provided because the connecting member 81 is not disposed in the second area A-2. As a result, it is possible to provide increased light blocking efficiency of the micro LED display module 20.

That is, the connecting members 81 are spaced apart from each other and are not formed in the second area A-2, and an optical layer such as the light blocking layer 90 may be formed in the empty space between adjacent connecting members 81. As a result, it is possible to increase space efficiency and manufacturing efficiency of the micro LED display module 20 and provide various types of optical layers.

Further, the light blocking layer 90 may be disposed in the gap portion R formed between adjacent connecting members 81 as shown in FIG. 5B.

Specifically, the light blocking layer 90 may be formed to expose the upper surface 51a of the micro LED 51 and cover the upper surface 70a of the display substrate 70.

In a case that the number of micro LEDs 51 is plural and the micro LEDs 51 include the red micro LED, the green micro LED, and the blue micro LED, the light blocking layer 90 may serve to space the red micro LED, the green micro LED, and the blue micro LED that emit different colors of light, respectively, thereby preventing the respective colors from being mixed.

Further, the light blocking layer 90 may absorb external light to increase a contrast ratio.

Here, the light blocking layer 90 may be formed of a black matrix photosensitive resin composition for a liquid display including a binder resin, a photopolymerization initiator, a black pigment, and a solvent, or a resin composition including a black pigment for blocking.

Further, the light blocking layer 90 may provide a surface that is flat and is on the same level with the upper surface 51a of the micro LED 51. Therefore, the light blocking layer 90 does not block light emitted from the micro LED 51, thereby preventing loss of light.

Further, the light blocking layer 90 may fill the gap portion R formed between the connecting members 81 and thus may rigidly fix the micro LED 51.

Hereinafter, a method of manufacturing the micro LED display module 20 according to an embodiment will be described in detail with reference to FIGS. 6 to 12.

Figure 6:
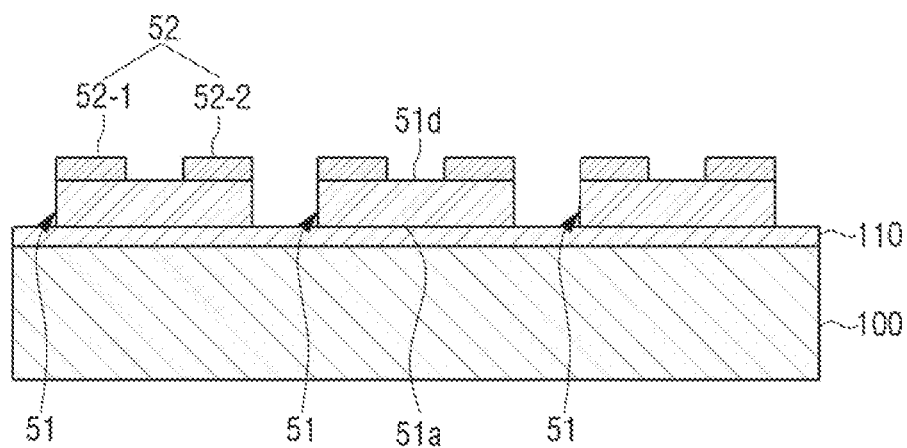
FIG. 6 is a schematic view illustrating a state in which a micro LED is disposed on a transfer substrate according to an embodiment.
Figure 7:
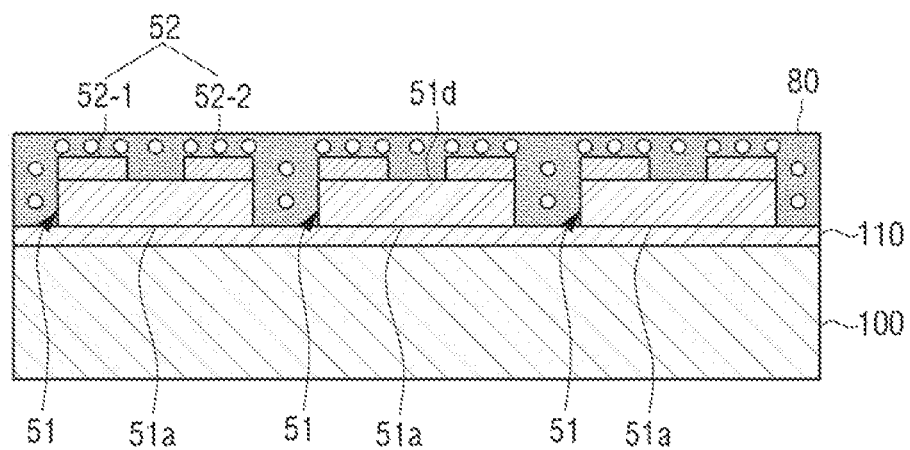
FIG. 7 is a schematic view showing a state in which a connecting member is stacked in the structure of FIG. 6 according to an embodiment.
Figure 8:
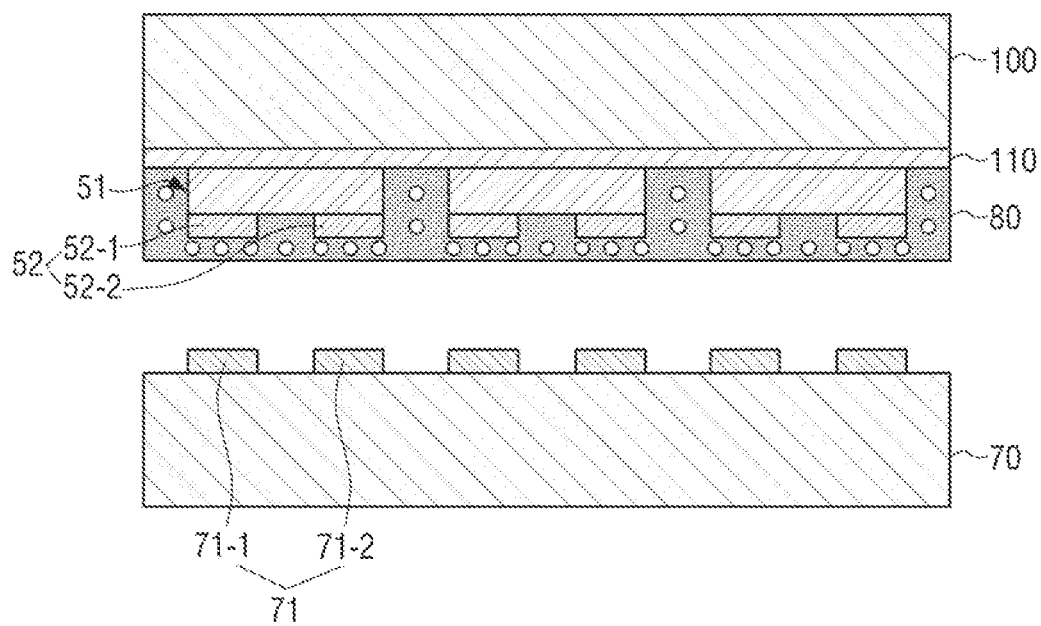
FIG. 8 is a schematic view illustrating a state in which the transfer substrate on which the micro LED is disposed, as showing in FIG. 7, is disposed above a display substrate according to an embodiment.
Figure 9:
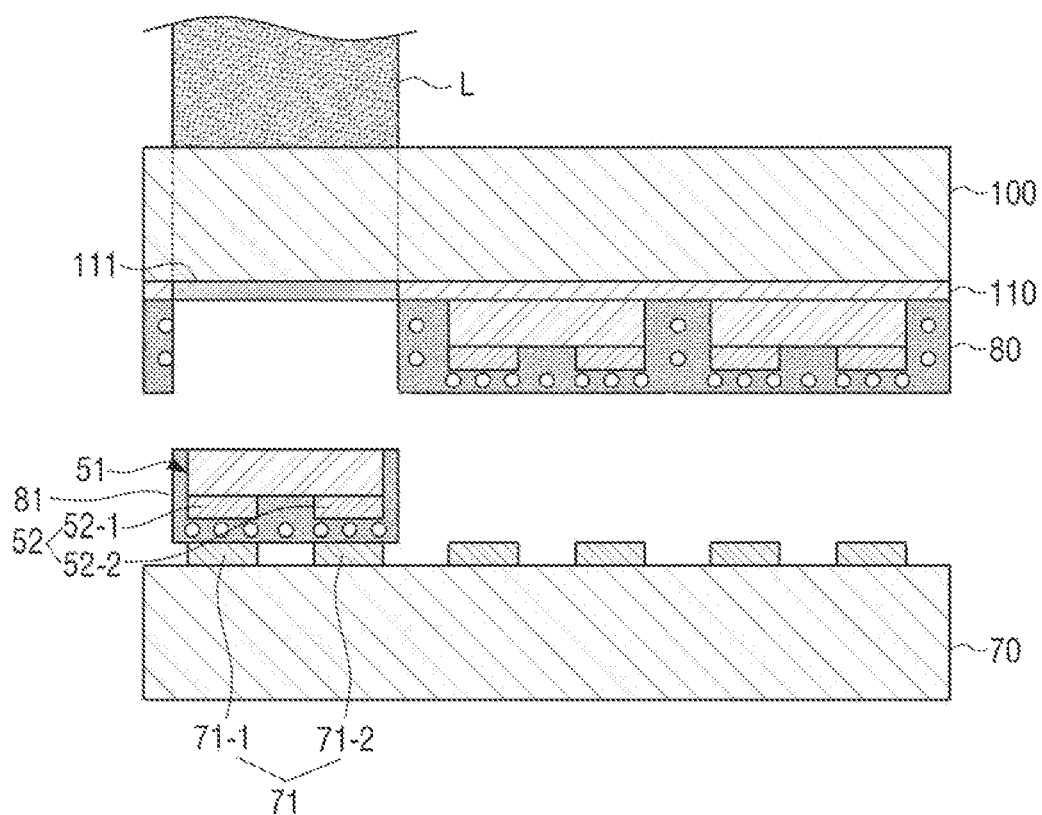
FIG. 9 is a schematic view illustrating a state in which the transfer substrate is irradiated with laser according to an embodiment.
Figure 10:
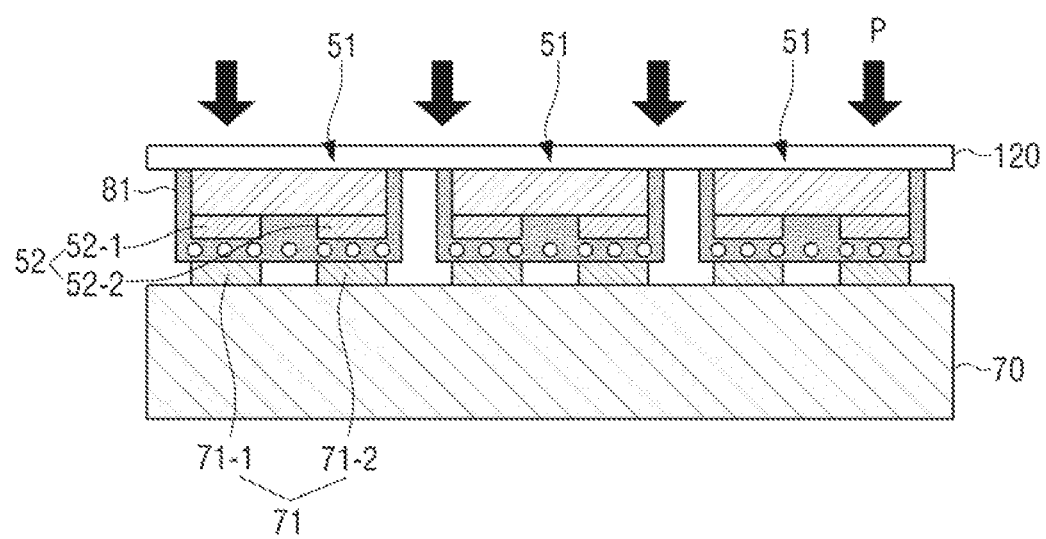
FIG. 10 is a schematic view illustrating a state in which a micro LED separated from the transfer substrate is bonded to the substrate according to an embodiment.
Figure 11:
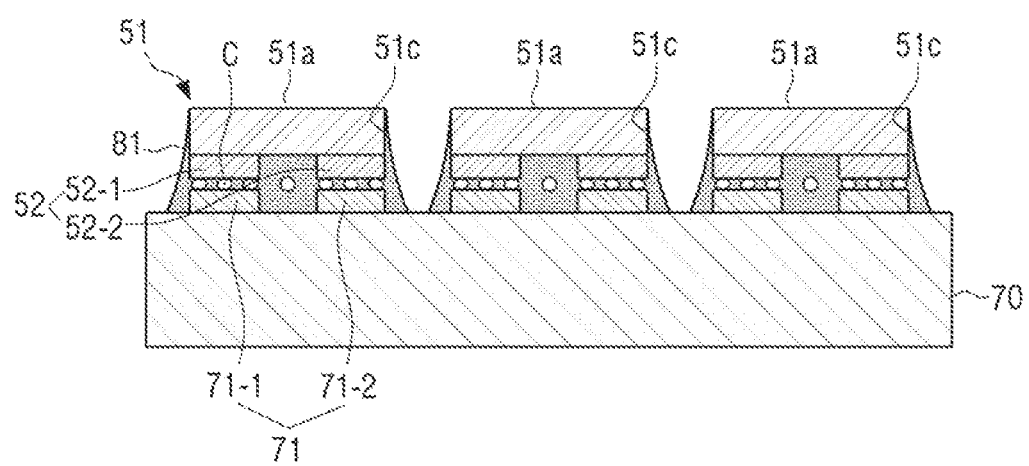
FIG. 11 is a cross-sectional view illustrating a part of a micro LED display module manufactured by a method of manufacturing a micro LED display module according to an embodiment.
Figure 12:
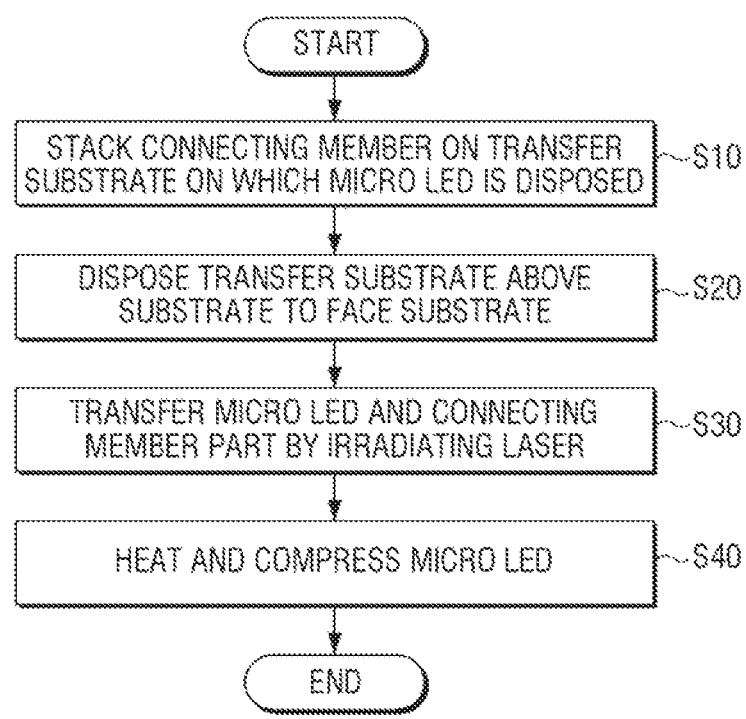
FIG. 12 is a flowchart illustrating the method of manufacturing a micro LED display module according to an embodiment.

FIG. 6 is a schematic view illustrating a state in which the micro LED 51 is disposed on a transfer substrate 100 according to an embodiment, FIG. 7 is a schematic view illustrating a state in which a connecting layer 80 is stacked on the structure shown in FIG. 6, FIG. 8 is a schematic view illustrating a state in which the transfer substrate 100 on which the micro LED 51 is disposed, as shown in FIG. 7, is disposed above the display substrate 70, FIG. 9 is a schematic view illustrating a state in which the transfer substrate 100 is irradiated with laser L, FIG. 10 is a schematic view illustrating a state in which a micro LED 51 separated from the transfer substrate 100 and is bonded to the display substrate 70, FIG. 11 is a cross-sectional view illustrating a part of the micro LED display module 20 manufactured by a method of manufacturing a micro LED display module according to an embodiment, and FIG. 12 is a flowchart illustrating the method of manufacturing a micro LED display module according to an embodiment.

First, the transfer substrate 100 on which the micro LED 51 is disposed may be provided as shown in FIG. 6. Specifically, the micro LED 51 may be attached to the transfer substrate 100 through an adhesive layer 110.

The transfer substrate 100 may be a substrate transported to above the display substrate 70 in a state in which the micro LED 51 is attached. For example, the transfer substrate 100 may be an interposer.

The adhesive layer 110 may attach the micro LED 51 and the transfer substrate 100 and may be formed of an adhesive material. Further, the adhesive layer 110 may be formed of a material that loses adhesion in case of being irradiated with the laser L.

For example, the adhesive layer 110 may be a dynamic release layer (DRL). Specifically, as shown in FIG. 9, in case that the adhesive layer 110 is irradiated with the laser L, the adhesive layer 110 expands, and the micro LED 51 positioned in a region irradiated with the laser L may be separated due to the expansion.

That is, the micro LED 51 may be separated from the transfer substrate 100 by expanding the adhesive layer 110 formed between the micro LED 51 and the transfer substrate 100 through heating using a laser irradiation method.

Further, the upper surface Ma of the micro LED 51 is attached to the transfer substrate 100 through the adhesive layer 110. That is, the micro LED 51 may be disposed on the transfer substrate 100 so that the plurality of connecting pads 52 are exposed and face upward.

The upper surface Ma of the micro LED 51 may be referred to as that light emitting surface.

Next, as shown in FIG. 7, the connecting layer 80 may be stacked on one surface of the transfer substrate 100 on which the micro LED 51 is disposed (operation S10). Specifically, the connecting layer 80 may be stacked to cover the micro LED 51 attached to the transfer substrate 100 through the adhesive layer 110.

In the embodiment shown in FIG. 7, the micro LED 51 is disposed on the transfer substrate 100 to expose the plurality of connecting pads 52, and thus the connecting layer 80 may be stacked on the transfer substrate 100 to cover the plurality of connecting pads 52.

That is, the connecting layer 80 may fill a space between the plurality of connecting pads 52 of the micro LED 51.

Further, the connecting layer 80 may be stacked on the transfer substrate 100 by a vacuum adsorption method or a rolling method.

In addition, although a case that the connecting layer 80 fills a space between the micro LEDs 51 has been shown, a case that the connecting layer 80 does not fill the space between the micro LEDs 51 is also possible depending on a process of stacking the connecting layer 80.

Here, the connecting layer 80 may be formed of the same material as the connecting member 81 described above. That is, the connecting member 81 refers to a portion separated from the connecting layer 80 as a part of the connecting layer 80, and the connecting layer 80 and the connecting member 81 are formed of the same material.

For example, in case that the connecting layer 80 is implemented by a non-conductive layer including the conductive particles C, the connecting member 81 may be implemented by the non-conductive layer including the conductive particles C as well.

Next, as shown in FIG. 8, the transfer substrate 100 to which the micro LED 51 is fixed and on which the connecting layer 80 is stacked may be disposed above the display substrate 70 on which the plurality of electrode pads 71 are formed.

That is, the transfer substrate 100 may be disposed above the display substrate 70 in which the plurality of thin-film transistors 140 are formed. Specifically, the transfer substrate 100 may be disposed above the display substrate 70 in which the plurality of thin-film transistors 140 are formed, to face the display substrate 70 (operation S20).

The plurality of connecting pads 52 of the micro LED 51 may be disposed to face the plurality of electrode pads 71 formed on the display substrate 70.

For example, as shown in FIG. 8, the first connecting pad 52-1 may be disposed to face the first electrode pad 71-1, and the second connecting pad 52-2 may be disposed to face the second electrode pad 71-2.

Then, as shown in FIG. 9, the transfer substrate 100 may be irradiated with the laser L in a state in which the transfer substrate 100 is aligned with and above the display substrate 70.

That is, the micro LED 51 and the connecting member 81 that is in contact with the micro LED 51 may be transferred to the display substrate 70 by using a laser transfer method (S30). Here, the laser transfer method may refer to a laser ablation method or a laser lift-off (LLO) method.

For example, a region of an upper portion of the transfer substrate 100 is irradiated with the laser L, the region being a region corresponding to a portion where one micro LED 51 to be separated is disposed.

Then, a predetermined portion of the adhesive layer 111 positioned in the region irradiated with the laser L expands due to heat transferred by the laser L, and the micro LED 51 disposed at a position corresponding to the predetermined adhesive layer 111 may be separated from the transfer substrate 100 due to the expansion of the predetermined adhesive layer 111.

That is, the micro LED 51 disposed in the region of the transfer substrate 100 irradiated with the laser L may be separated from the transfer substrate 100 and transferred onto the display substrate 70.

Here, the connecting member 81, which is a part of the connecting layer 80 disposed at a position corresponding to the predetermined adhesive layer 111, may be separated from the transfer substrate 100 together with the one micro LED 51 separated from the transfer substrate 100.

For example, in case that the micro LED 51 disposed at the position corresponding to the predetermined portion of the adhesive layer 111 is separated, the connecting member 81 that is adjacent to the micro LED 51 and is disposed at the position corresponding to the predetermined portion of the adhesive layer 111 may also be separated from the transfer substrate 100 together with the micro LED 51.

Further, the one micro LED 51 separated from the transfer substrate 100 may be seated on the display substrate 70. Specifically, the one micro LED 51 separated from the transfer substrate 100 may be seated on the plurality of electrode pads 71 of the display substrate 70.

In the embodiment of FIG. 9, the one micro LED 51 is only seated on the plurality of electrode pads 71, and is not electrically connected to the plurality of electrode pads 71. Further, the plurality of connecting pads 52 of the one micro LED 51 may be arranged to face the plurality of electrode pads 71.

In the process of transferring the micro LED 51, the connecting member 81 may be disposed only in the first area A-1 and does not have to be disposed in the second area A-2 which is the repairing area.

That is, the display substrate 70 is divided into the first area A-1 and the second area A-2, and in the process of transferring the micro LED 51, the micro LED 51 may be transferred only to the first area A-1.

Next, in a state in which a plurality of micro LEDs 51 are disposed on the display substrate 70 by repeatedly performing the transferring process of FIG. 9, thermal compression (P) may be performed on the micro LEDs 51 as shown in FIG. 10.

The thermal compression P may be performed simultaneously on multiple micro LEDs 51 through a separate thermal compression member 120.

Further, the thermal compression P may be performed until the micro LED 51 and the display substrate 70 are electrically connected to each other.

That is, as shown in FIG. 11, the connecting member 81 disposed at a position corresponding to the micro LED 51 may be deformed due to the thermal compression, and the micro LED 51 may be electrically and physically connected to the display substrate 70 through the connecting member 81.

That is, the micro LED 51 may be bonded to the display substrate 70 by performing the thermal compression P on the micro LED 51 in a state in which the micro LED 51 is in contact with the display substrate 70 through the connecting member 81 disposed adjacent to the micro LED 51.

Similarly, the micro LED 51 may be heated and compressed to bond the micro LED 51 to the display substrate 70 by the connecting member 81 (operation S40).

Further, the connecting member 81 may be deformed due to the thermal compression to cover the side surface of the micro LED 51.

That is, in the process of bonding the micro LED 51, the connecting member 81 may be deformed to cover the side surface 51c of the micro LED 51 and expose the upper surface 51a of the micro LED 51.

Similarly, in case that the micro LED 51 is heated and compressed, the connecting member 81 that is in contact with the first surface 51d of the micro LED 51 comes into contact with the plurality of electrode pads 71 formed on the display substrate 70. Further, the connecting member 81 that is in contact with the side surface 51c of the micro LED 51 may form the curved portion 83 without covering the upper surface 51a of the micro LED 51.

In the state shown in FIG. 11, the light blocking layer 90 may be coated on the display substrate 70 to expose the upper surface 51a of the micro LED 51 and cover the upper surface 70a of the display substrate 70, as shown in FIG. 5B.

As described above, the plurality of connecting members 81 may be transferred while being spaced apart from each other by stacking the connecting layer 80 on the transfer substrate 100 in advance to cover the micro LED 51 disposed on the transfer substrate 100, rather than applying the connecting layer 80 on the display substrate 70.

As a result, the connecting layer 80 and the connecting member 81 are not disposed in the second area A-1, and thus a repairing process in the second area A-2 may be facilitated. At the same time, it is also possible to greatly improve space efficiency by forming multiple optical layers in the second area A-2 and the gap portion R formed between the connecting members 81.

Hereinafter, a bonding structure of a micro LED 51 and a display substrate 70 according to another embodiment will be described in detail with reference to FIG. 13.

The same components will be denoted by the same reference numerals, and an overlapping description thereof will be omitted. For example, the micro LED 51, a plurality of connecting pads 52, the display substrate 70, a plurality of electrode pads 71, and a light blocking layer 90 are the same as those described above, and thus an overlapping description thereof will be omitted.

Figure 13:
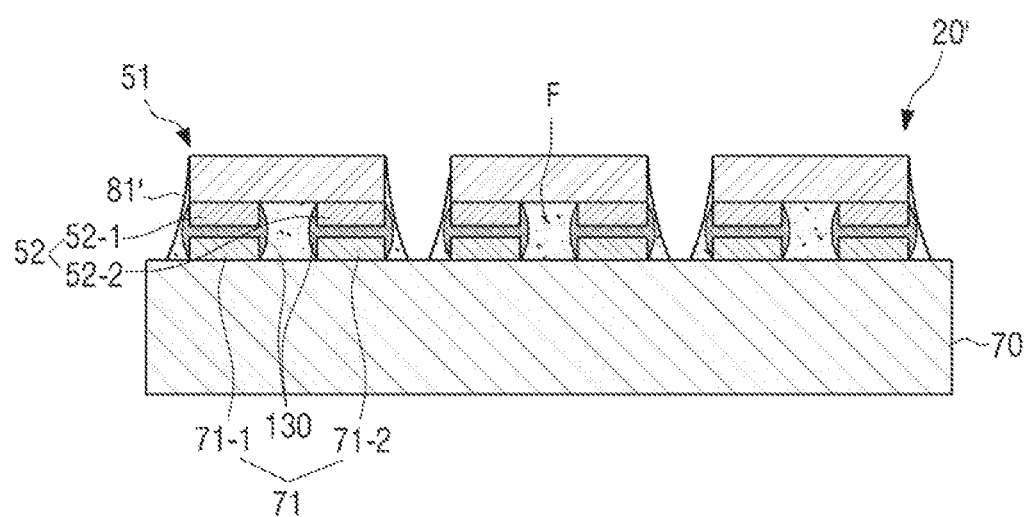
FIG. 13 is a cross-sectional view illustrating a state in which a micro LED is disposed on a substrate according to an embodiment.
Figure 14:
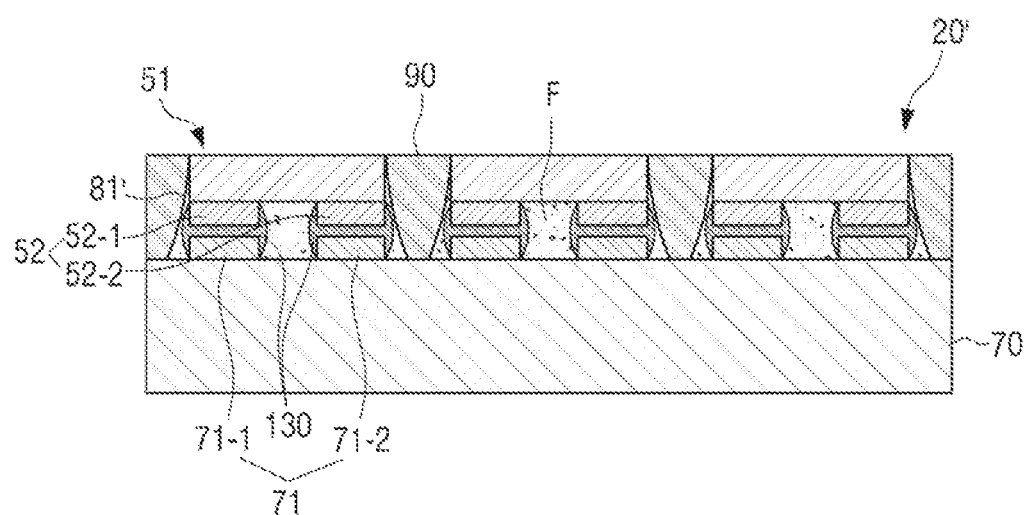
FIG. 14 is a cross-sectional view illustrating a state in which a light blocking layer is formed in the structure of FIG. 13 according to an embodiment.

FIG. 13 is a cross-sectional view illustrating a state in which the micro LED 51 is disposed on the display substrate 70 according to an embodiment, and FIG. 14 is a cross-sectional view illustrating a state in which the light blocking layer 90 is formed on a structure of FIG. 13.

As shown in FIG. 13, the micro LED 51 may be electrically and physically connected to the display substrate 70 through a plurality of soldering members 130. For example, a first connecting pad 52-1 of the micro LED 51 is electrically connected to a first electrode pad 71-1 through the soldering member 130.

Similarly, a second connecting pad 52-2 of the micro LED 51 is electrically connected to a second electrode pad 71-2 through the soldering member 130.

That is, the plurality of soldering members 130 may be disposed between the display substrate 70 and the micro LED 51 and electrically connect the micro LED 51 and the display substrate 70 to each other.

Further, the plurality of soldering members 130 may be spaced apart from each other at a predetermined interval. Therefore, it is possible to prevent a short circuit caused by a contact between the plurality of soldering members 130.

The soldering member 130 may be formed of a conductive material and may be used for metal bonding. For example, the metal bonding may be bonding using various materials, such as Au—In bonding, Au—Sn bonding, Cu pillar-SnAg bump bonding, or Ni pillar-SnAg bump bonding depending on the material of the soldering member 130.

Further, a connecting layer 80' and a connecting member 81' may be formed of a non-conductive material with a fluxing function. In addition, the connecting layer 80' and the connecting member 81' may include flux particles F for implementing the fluxing function.

For example, the non-conductive material may include a thermosetting resin. Examples of a main component of the thermosetting resin may include an epoxy resin, a phenol resin, a polyimide resin, a polyurethane resin, a melamine resin, and a urea resin.

Further, the thermosetting resin may include one or more types of mixtures selected from the group consisting of the resins described above. Further, as the thermosetting resin, a resin that is liquid at room temperature is selected. In case that a solid resin is selected, the solid resin may be used in combination with a resin that is liquid at room temperature.

The connecting member 81' formed of the non-conductive material may fill a gap between the plurality of soldering members 130 to prevent the soldering members 130 from being electrically connected to each other, thereby preventing a short circuit.

As a result, the connecting member 81' may ensure electrically stable driving of the micro LED 51.

As for the fluxing function, in case of melting the soldering member 130, the flux particles F reduce an oxidized portion of a surface of the soldering member 130, and a coated film is pushed out by the molten soldering member 130, thereby making it possible to prevent the soldering member 130 from being oxidized.

The flux particles F may be disposed to enclose the surface of the soldering member 130 to isolate the surface of the soldering member 130 from external oxygen, thereby preventing oxidation of the soldering member 130.

For example, the flux particles F may include various fluxes such as an inorganic flux such as a zinc chloride-based or a zinc chloride-ammonium chloride-based flux, an organic flux such as glutamic acid hydrochloride or ethylenediamine stearic acid hydrochloride, a rosin-based flux such as an active rosin or an inactive rosin, and an aqueous flux such as salts, acids, or amines.

Further, an organic acid, preferably, a dibasic acid having an alkyl group as a side chain may be selected to improve a fluxing effect. The dibasic acid is not particularly limited but may have 6 or more carbon atoms. Examples of the alkyl group as the side chain may include a lower alkyl group having 1 to 5 carbon atoms. The number of alkyl groups as the side chain may be singular or plural. In case that multiple alkyl groups are contained in a molecule of the organic acid, the alkyl groups may be the same as each other or different from each other.

That is, the connecting layer 80' and the connecting member 81' may be formed by mixing the flux particles F with the thermosetting resin material.

Therefore, the connecting member 81' may prevent the oxidation of the soldering member 130 and fill a gap between the plurality of soldering members 130 to prevent the soldering members 130 from being electrically connected to each other, thereby preventing a short circuit.

Further, the connecting members 81' may be spaced apart from each other at a predetermined interval as shown in FIG. 14. Therefore, the light blocking layer 90 may be formed in a gap portion formed between the connecting members 81'.

That is, the connecting layer 80' and the connecting member 81' according to an embodiment are different from the connecting layer 80 and the connecting member 81 described above only in regard to the material, and the disposition and the structures thereof are the same as the connecting layer 80 and the connecting member 81.

Hereinafter, a method of manufacturing a micro LED display module 20' according to an embodiment will be described in detail with reference to FIGS. 15 to 20.

The same components will be denoted by the same reference numerals, and an overlapping description thereof will be omitted. For example, a micro LED 51, a plurality of connecting pads 52, a display substrate 70, a plurality of electrode pads 71, and a light blocking layer 90 are the same as those described above, and thus an overlapping description thereof will be omitted.

Figure 15:
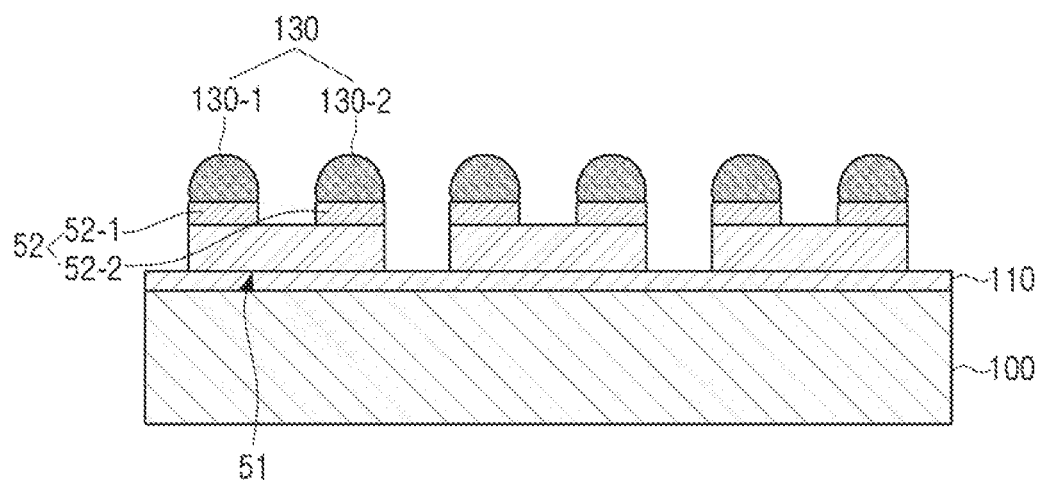
FIG. 15 is a schematic view illustrating a state in which a micro LED is disposed on a transfer substrate according to an embodiment.
Figure 16:
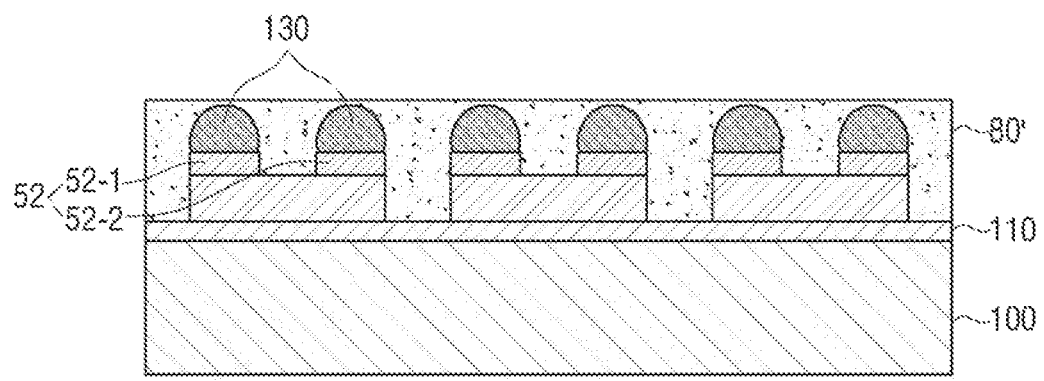
FIG. 16 is a schematic view illustrating a state in which a connecting member is stacked on the structure of FIG. 15 according to an embodiment.
Figure 17:
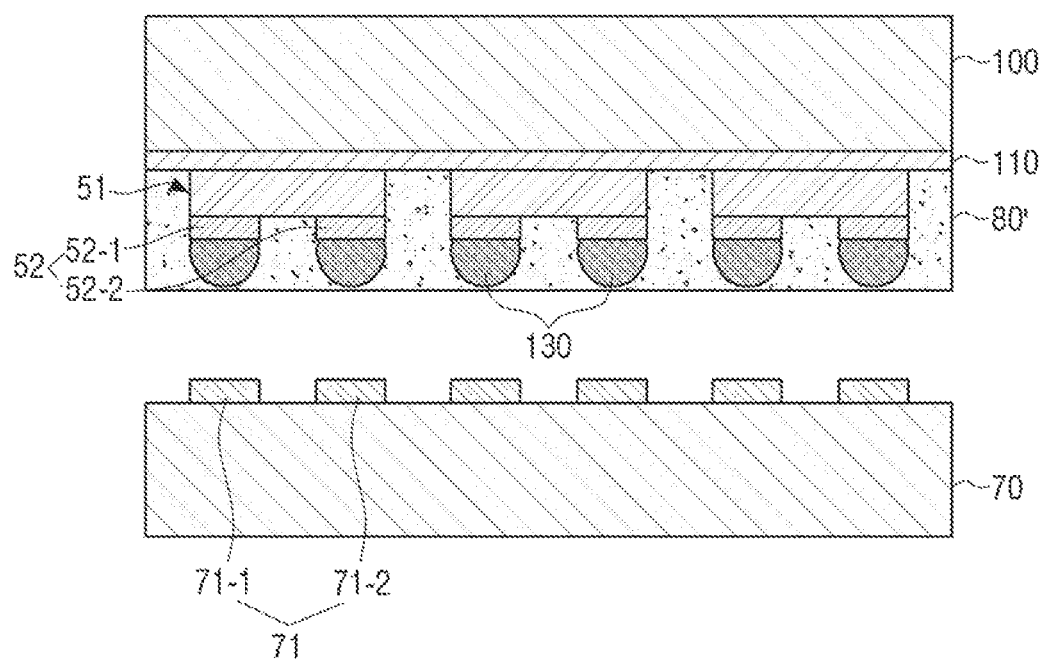
FIG. 17 is a schematic view illustrating a state in which the transfer substrate on which the micro LED is disposed, as shown in FIG. 16, is disposed above a display substrate according to an embodiment.
Figure 18:
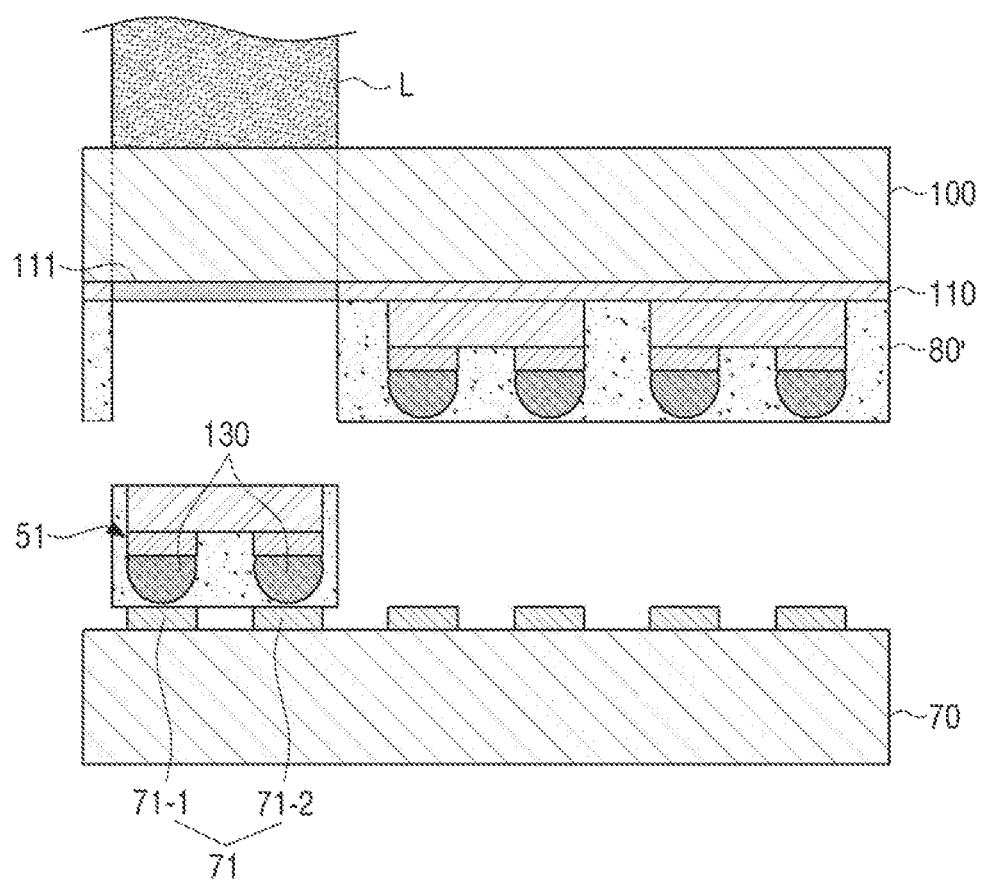
FIG. 18 is a schematic view illustrating a state in which the transfer substrate is irradiated with laser according to an embodiment.
Figure 19:
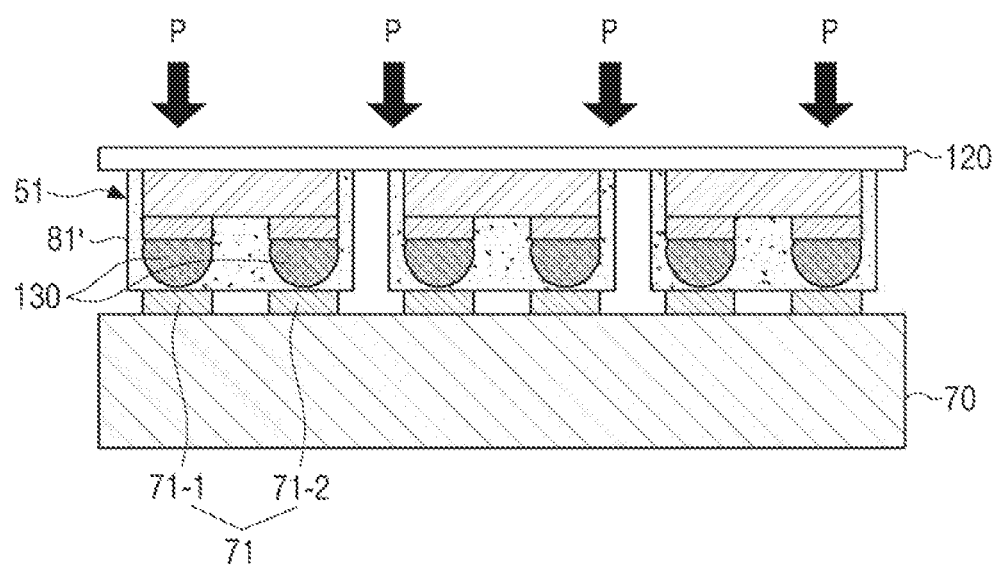
FIG. 19 is a schematic view illustrating a state in which a micro LED separated from the transfer substrate is bonded to the display substrate according to an embodiment.
Figure 20:
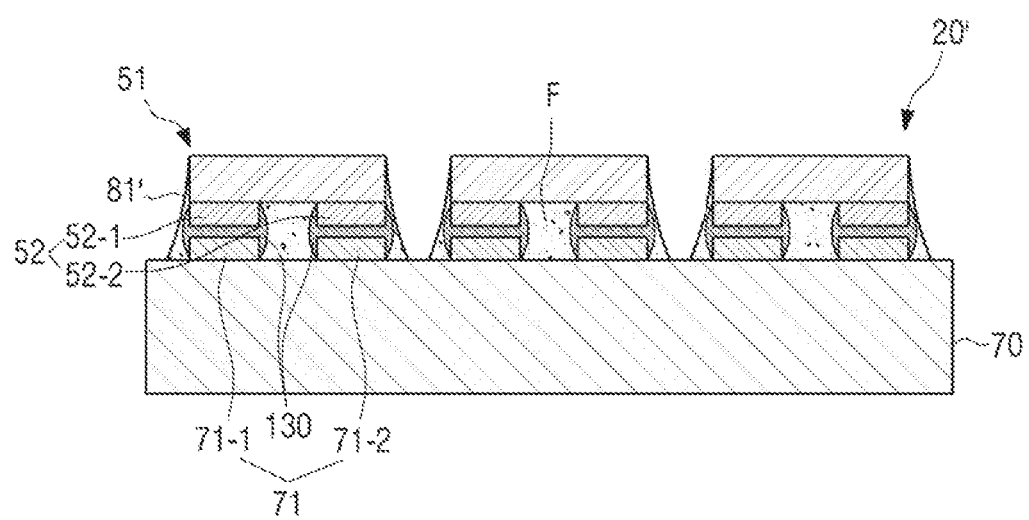
FIG. 20 is a cross-sectional view illustrating a part portion of a micro LED display module manufactured by a method of manufacturing a micro LED display module according to an embodiment.

FIG. 15 is a schematic view illustrating a state in which the micro LED 51 is disposed on a transfer substrate 100 according to an embodiment, FIG. 16 is a schematic view illustrating a state in which a connecting layer 80' is stacked on the structure of FIG. 15, FIG. 17 is a schematic view illustrating a state in which the transfer substrate 100 on which the micro LED 51 is disposed as shown in FIG. 16 is disposed above the display substrate 70, FIG. 18 is a schematic view illustrating a state in which the transfer substrate 100 is irradiated with laser L, FIG. 19 is a schematic view illustrating a state in which a micro LED 51 is separated from the transfer substrate 100 and is bonded to the display substrate 70, and FIG. 20 is a cross-sectional view illustrating a part of the micro LED display module 20' manufactured by the method of manufacturing a micro LED display module according to the embodiment shown in FIGS. 15 to 19.

First, the transfer substrate 100 on which the micro LED 51 is disposed may be provided as shown in FIG. 15. Specifically, the micro LED 51 may be attached to the transfer substrate 100 through an adhesive layer 110.

Here, soldering members 130 may be formed on the plurality of connecting pads 52, respectively. For example, a first soldering member 130-1 may be disposed on a first connecting pad 52-1, and a second soldering member 130-2 may be disposed on a second connecting pad 52-2.

Next, as shown in FIG. 16, the connecting layer 80' may be stacked on one surface of the transfer substrate 100 on which the micro LED 51 is disposed. Specifically, the connecting layer 80' may be stacked to cover the micro LED 51 attached to the transfer substrate 100 through the adhesive layer 110.

A stacking structure of the connecting layer 80' shown in FIG. 16 is the same as the connecting layer 80 shown in FIG. 7, and thus an overlapping description will be omitted.

Next, as shown in FIG. 17, the transfer substrate 100 to which the micro LED 51 is fixed and on which the connecting layer 80' is stacked may be disposed above the display substrate 70 on which the plurality of electrode pads 71 are formed.

Here, the plurality of connecting pads 52 of the micro LED 51 may be disposed to face the plurality of electrode pads 71 formed on the display substrate 70. Further, the plurality of soldering members 130 may also be disposed to face the plurality of electrode pads 71, respectively.

Then, as shown in FIG. 18, the transfer substrate 100 may be irradiated with the laser L in a state in which the transfer substrate 100 is aligned with and above the display substrate 70.

Then, a predetermined portion of an adhesive layer 111 positioned in a region irradiated with the laser L expands due to heat transferred by the laser L, and the micro LED 51 disposed at a position corresponding to the predetermined portion of the adhesive layer 111 may be separated from the transfer substrate 100 due to the expansion of the predetermined portion of the adhesive layer 111.

Here, a connecting member 81' which is a part of the connecting layer 80' disposed at a position corresponding to the predetermined portion of the adhesive layer 111 may be separated from the transfer substrate 100 together with one micro LED separated from the transfer substrate 100.

In the process of transferring the micro LED 51, the connecting member 81' may be disposed only in a first area A-1 and does not have to be disposed in a second area A-2 which is the repairing area.

Next, in a state in which the transferring process of FIG. 18 is repeatedly performed and the micro LEDs 51 are thus disposed on the display substrate 70, thermal compression (P) may be performed on the micro LEDs 51 as shown in FIGS. 19 and 20.

Here, the plurality of soldering members 130 may be melted. The flux particles F reduce an oxidized portion of a surface of the soldering member 130, and a coated film is pushed out by the molten soldering member 130, thereby making it possible to prevent the soldering member 130 from being oxidized.

As a result, the plurality of soldering members 130 may electrically connect the plurality of connecting pads 52 and the plurality of electrode pads 71 to each other, and at the same time, a plurality of connecting members 81' enclosing the plurality of soldering members 130 may also be hardened.

Although the various embodiments of the disclosure have been individually described hereinabove, the respective embodiments are not necessarily implemented singly, but may also be implemented so that configurations and operations thereof are combined with those of one or more other embodiments.

Although embodiments of the disclosure have been shown and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope of the disclosure.

What is claimed is:

1. A method of manufacturing a micro light emitting diode (LED) display module, the method comprising:
   stacking a connecting layer on a transfer substrate on which a micro LED is disposed;
   positioning the transfer substrate above a display substrate, in which a plurality of thin-film transistors are formed, so that the micro LED faces the display substrate;
   transferring, to the display substrate, the micro LED and a connecting member by using a laser transfer method, wherein the connecting member is in contact with the micro LED and is separated from the connecting layer; and
   heating the micro LED and compressing the micro LED against the display substrate to bond the micro LED to the display substrate by the connecting member,
   wherein a connecting member part, which is a part of the connecting member, is separated from the connecting member by a laser,
   wherein the display substrate is divided into a first area and a second area, and
   wherein the transferring the micro LED comprises transferring the micro LED to only the first area, leaving the second area reserved for an alternative micro LED in case that the micro LED transferred to the first area is defective.

2. The method as claimed in claim 1, wherein the heating and compressing the micro LED comprises heating and compressing the micro LED to make a portion of the connecting member that is in contact with a first surface of the micro LED come into contact with a plurality of electrode pads provided on the display substrate and to make a portion of the connecting member that is in contact with a side surface of the micro LED form a curved portion without covering a light emitting surface of the micro LED.

3. The method as claimed in claim 1, further comprising applying a light blocking layer on the display substrate to expose a light emitting surface of the micro LED and cover the display substrate.

4. The method as claimed in claim 1, wherein the transferring the micro LED comprises separating the micro LED from the transfer substrate by expanding an adhesive layer provided between the micro LED and the transfer substrate through heating using a laser irradiation method.

5. The method as claimed in claim 4, wherein the adhesive layer comprises a dynamic release layer.

6. The method as claimed in claim 2, wherein the positioning the transfer substrate comprises arranging the plurality of electrode pads disposed on the display substrate and connected to each of the plurality of thin-film transistors to each face a respective one of a plurality of connecting pads of the micro LED.

7. The method as claimed in claim 6, wherein the connecting member comprises an anisotropic conductive film or anisotropic conductive paste.

8. The method as claimed in claim 6, wherein soldering members are provided on the plurality of connecting pads, respectively,
wherein the connecting member comprises a non-conductive material having a fluxing function, and
wherein the heating and compressing the micro LED comprises electrically connecting the plurality of electrode pads and the plurality of connecting pads through the soldering members.

9. A micro light emitting diode (LED) display module comprising:
a plurality of micro LEDs;
a substrate on which the plurality of micro LEDs are disposed;
a plurality of thin-film transistors provided in the substrate;
a plurality of electrode pads connected to each of the plurality of thin-film transistors;
a plurality of soldering members disposed between the plurality of electrode pads and a plurality of connecting pads, the plurality of soldering members being configured to electrically connect the plurality of electrode pads and the plurality of connecting pads to each other; and
a plurality of connecting members disposed between the plurality of soldering members to prevent a short circuit caused by a contact between the plurality of soldering members, the plurality of connecting members comprising a non-conductive material having a fluxing function,
wherein the substrate is divided into a first area and a second area,
wherein the second area is configured to accept an alternative micro LED in case that a micro LED transferred to the first area is defective, and
wherein the plurality of micro LEDs are each connected only to portions of the plurality of electrode pads provided in the first area.

10. The micro LED display module as claimed in claim 9, wherein a side surface portion of each of the plurality of connecting members defines a curved surface, the side surface portion of each of the plurality of connecting members being in contact with a side surface of a respective micro LED.

11. The micro LED display module as claimed in claim 9, further comprising a light blocking layer configured to expose a light emitting surface of each of the plurality of micro LEDs and cover the substrate.

12. The micro LED display module as claimed in claim 9, wherein the plurality of micro LEDs comprise a red micro LED which emits red light, a green micro LED which emits green light, and a blue micro LED which emits blue light, and
wherein the red micro LED, the green micro LED, and the blue micro LED are sequentially arranged on the substrate.

13. A display apparatus comprising:
a plurality of micro light emitting diode (LED) display modules;
an arrangement member configured to support the plurality of micro LED display modules; and
a housing to which the plurality of micro LED display modules and the arrangement member are fixed,
wherein each of the plurality of micro LED display modules comprises:
a plurality of micro LEDs,
a substrate on which a plurality of electrode pads are disposed and in which a plurality of thin-film transistors are disposed,
a plurality of soldering members connecting each of the plurality of micro LEDs to the plurality of electrode pads, and
a plurality of connecting members disposed between the plurality of soldering members to prevent a short circuit caused by a contact between the plurality of soldering members, the plurality of connecting members comprising a non-conductive material having a fluxing function,
wherein the plurality of electrode pads are partially exposed through the plurality of connecting members,
wherein the substrate is divided into a first area and a second area,
wherein the second area is configured to accept an alternative micro LED in case that a micro LED transferred to the first area is defective, and
wherein the plurality of micro LEDs are each connected only to portions of the plurality of electrode pads provided in the first area.

\* \* \* \* \*